(12) United States Patent
Ahmed et al.

(10) Patent No.: US 7,064,042 B1
(45) Date of Patent: Jun. 20, 2006

(54) SELF ALIGNED COMPACT BIPOLAR JUNCTION TRANSISTOR LAYOUT, AND METHOD OF MAKING SAME

(75) Inventors: Shahriar Ahmed, Portland, OR (US); Mark Bohr, Aloha, OR (US); Stephen Chambers, Portland, OR (US); Richard Green, Aloha, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 10/877,749

(22) Filed: Jun. 24, 2004

Related U.S. Application Data

(62) Division of application No. 10/418,396, filed on Apr. 17, 2003, which is a division of application No. 10/013,225, filed on Dec. 10, 2001, now Pat. No. 6,579,771.

(51) Int. Cl.
*H01L 21/331* (2006.01)
(52) U.S. Cl. .................................... 438/350; 257/565
(58) Field of Classification Search ............... 438/205, 438/340, 312–313, 343, 350; 257/565, 592, 257/586–588
See application file for complete search history.

(56) References Cited

U.S. PATENT DOCUMENTS

| 4,142,117 | A | | 2/1979 | Chang |
| 4,330,569 | A | | 5/1982 | Gulett et al. |
| 4,830,972 | A | | 5/1989 | Hamasaki |
| 5,137,840 | A | * | 8/1992 | Desilets et al. ............. 438/371 |
| 5,323,032 | A | | 6/1994 | Sato et al. |
| 5,523,245 | A | | 6/1996 | Imai |
| 5,837,929 | A | | 11/1998 | Adelman |
| 2001/0048134 | A1 | | 12/2001 | Park |

* cited by examiner

*Primary Examiner*—David Vu
(74) *Attorney, Agent, or Firm*—Blakely, Sokoloff, Taylor & Zafman LLP

(57) ABSTRACT

The invention relates to a process of forming a bipolar junction transistor (BJT) that includes forming a topology over a substrate. Thereafter, a spacer is formed at the topology. A base layer is formed from epitaxial silicon above the spacer and at the topology. A leakage block structure is formed in the substrate by out-diffusion from the spacer. Thereafter a BJT is completed with the base layer and the spacer.

5 Claims, 6 Drawing Sheets

SELF ALIGNED COMPACT BIPOLAR JUNCTION TRANSISTOR LAYOUT, AND METHOD OF MAKING SAME

This is a Divisional application of Ser. No. 10/418,396 filed Apr. 17, 2003 which is presently pending and which a Divisional application of Ser. No. 10/013,225 filed Dec. 10, 2001 now U.S. Pat. No. 6,579,771.

FIELD OF THE INVENTION

The present invention relates generally to integrated circuit fabrication, and, more specifically, the present invention relates to the fabrication of a self-aligned device design and process flow that allows for a compact bipolar junction transistor layout.

BACKGROUND OF THE INVENTION

Description of Related Art

An epitaxial bipolar junction transistor (BJT) exhibits the presence of defects at the monocrystalline/polycrystalline boundary of the base. The defects may include misfit dislocations, stacking faults, screw dislocations, and the like. Such defects may cause unacceptable current leakage in the BJT. Where the defects are large enough, a short may even occur between the emitter and the collector.

FIG. 9 illustrates an existing BJT 10. The BJT 10 includes a substrate 12, a collector structure 14 disposed in substrate 12, a buried layer 16, and deep trench isolation (DTI) structures 18. BJT also includes shallow trench isolation (STI) structures that include a source-proximate STI (source STI) 20, an emitter-proximate STI (emitter STI) 22, and a base-proximate STI (base STI) 24. Upon substrate 12, an epitaxial layer is formed that includes a monocrystalline epitaxial base 26 and a polycrystalline epitaxial base 28. An emitter structure 30 is disposed above the epitaxial layer. With the interface between monocrystalline epitaxial base 26 and polycrystalline epitaxial base 28, a leakage region 32 occurs due to crystalline defects and other reasons.

One method of reducing the leakage is to heavily dope the monocrystalline-polycrystalline boundary region with an element that will electrically insulate, in order to enclose the leakage region 32. The implanted, doped enclosure 34 may reduce or significantly eliminate the possibility of the defects being an additional source of leakage in the BJT 10. In order for the implant to get through, a sufficient amount of a first space 36 needs to remain between the edge of the monocrystalline base 26 and the polysilicon of emitter structure 30, where the leakage region 32 may be found. Additional space 38 is needed between the edge of the polysilicon of structure 30 and the emitter cut to avoid the high dose of boron from diffusing from doped enclosure 34 to the emitter/base junction.

The need for both the heavy doping and the spaces 36 and 38 causes the BJT 10 to be large in cell layout size. A large cell layout size increases parasitic capacitance and resistance, both of which are associated with the base and collector. This increase degrades the performance of the BJT 10. FIG. 10 is a top plan view of projected perimeters of a BJT layout 10 formed according to known technique, that may be correlated to FIG. 9. A collector perimeter 40 comprises the overall outline of the projected perimeter of the BJT layout 10. Within collector perimeter 40 is a base perimeter 42, the emitter cut 44 or emitter opening, a collector tap 46, and a base tap 48. Additionally, the doping pattern that fills the first space 36 is seen as a perimeter around the polysilicon of emitter structure 30. In the known technique, the base perimeter 42 may substantially encompass the perimeter of polysilicon that is emitter structure 30, and the projection of base tap 48.

BRIEF DESCRIPTION OF THE DRAWINGS

In order that the manner in which the embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

Figure 1:
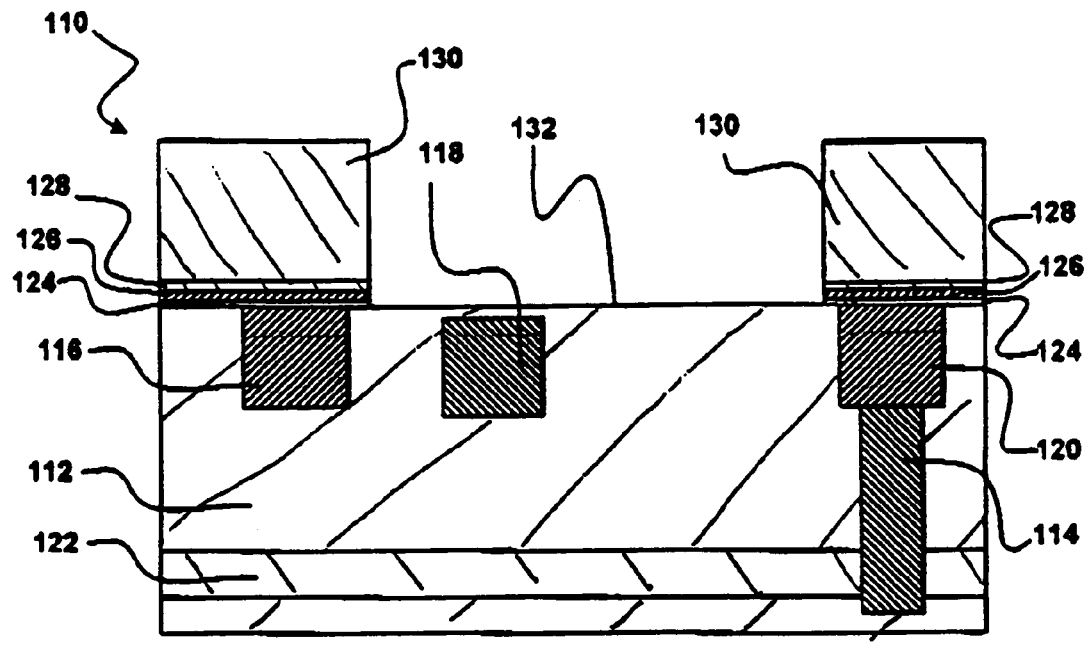
FIG. 1 is an elevational cross-section of a semiconductor structure that is being fabricated into an inventive bipolar junction transistor (BJT) according to an embodiment of the present invention.

The present invention relates to a process of forming a bipolar junction transistor (BJT) that has a compact layout and that resists leakage. FIG. 1 illustrates the beginnings of a process flow according to one embodiment. The precursor of a bipolar junction transistor 110 is fabricated from a substrate 112, that includes a deep trench isolation (DTI) 114, a collector-proximate shallow trench isolation (STI) 116, a collector structure 118 disposed in substrate 112, and a base-proximate STI 120. Embedded in substrate 112 is an n-collector buried layer 122, in an exemplary embodiment where BJT 110 is an NPN structure.

An optional oxide pre-layer 124 is disposed above and on substrate 112. Above substrate 112, an etch resistant layer including a first layer 126 is formed, followed by a second layer 128. Optional oxide pre-layer 124, is formed on substrate 112 by a process flow selected from thermal growth, deposition, and native oxide growth. Whether first layer 126 and second layer 128 are made of different materials, e.g. oxide-nitride, or whether they are made of differing types of the same material, e.g. oxide—oxide, first layer 126 and second layer 128 have different responses to an etch recipe. Similarly, and optionally, first layer 126 and second layer 128 have different responses to an oxidation process.

In one embodiment, first layer 126 is an oxide layer. The first layer 126, when it is an oxide layer, may be a thermal oxide, a deposited oxide, or a combination thereof. Oxides that may be selected include silica, titania, ceria, thoria, alumina, zirconia, hafnia, and the like. In this embodiment, second layer 128 is a nitride layer. Second layer may be selected from silicon nitride, titanium nitride, aluminum nitride, and the like.

According to the present invention, a process flow integration is selected that dictates limited composition options of first layer 126 and second layer 128. In one embodiment first layer 126 and second layer 128 are configured wherein the first layer and the second layer are respectively selected from a first oxide layer and a second nitride layer. In another embodiment, the first layer and the second layer are respectively selected from a first nitride layer and a second oxide layer. In another embodiment, the first layer and the second layer are respectively selected from a first oxide layer and a second oxide layer. In another embodiment, the first layer and the second layer are respectively selected from a first nitride layer and a second nitride layer. In another embodiment, the first layer and the second layer are respectively selected from a first inorganic layer and a second organic layer. In another embodiment, the first layer and the second layer are respectively selected from a first organic layer and a second inorganic layer. In another embodiment, the first layer and the second layer are respectively selected from a first organic layer and a second organic layer. In another embodiment, the first layer and the second layer are respectively selected from and a first inorganic layer and a second inorganic layer.

A topology over substrate 112 is formed in first layer 126, second layer 128, and optional oxide pre-layer 124. A topology is understood to be a vertical relief in at least one layer with respect to the substrate. Patterning may be accomplished by a mask 130. Mask 130 may be a spin-on resist as is know in the art, or it may be a hard mask as is understood in the art.

In one exemplary embodiment, after forming oxide pre-layer 124 on the substrate 112, an oxide embodiment of first layer 126 is formed, a nitride embodiment of second layer 128 is formed, mask 130 is formed, and patterning is carried out with an anisotropic dry etching of second layer 128. The anisotropic dry etching may be a reactive ion etch (RIE), followed by an alternative wet clean as is known in the art.

Thereafter, patterning is finished with an isotropic wet etching of first layer 126 to expose an upper surface 132 and to form the topology. Optionally, oxide pre-layer 124 is etched in connection with the etching of first layer 126. First layer 126 and second layer 128 may be selected to be either oxide, nitride, organic, or otherwise according to a specific process integration. For example, where BJT 110 is part of a logic structure, fabrication of an embedded memory array elsewhere on the substrate may call for a nitride layer and an oxide layer. In this example, first layer 126 may be the same nitride- and second layer 128 may be the same oxide that act to cover the memory array during processing of the BJT 110.

Figure 2:
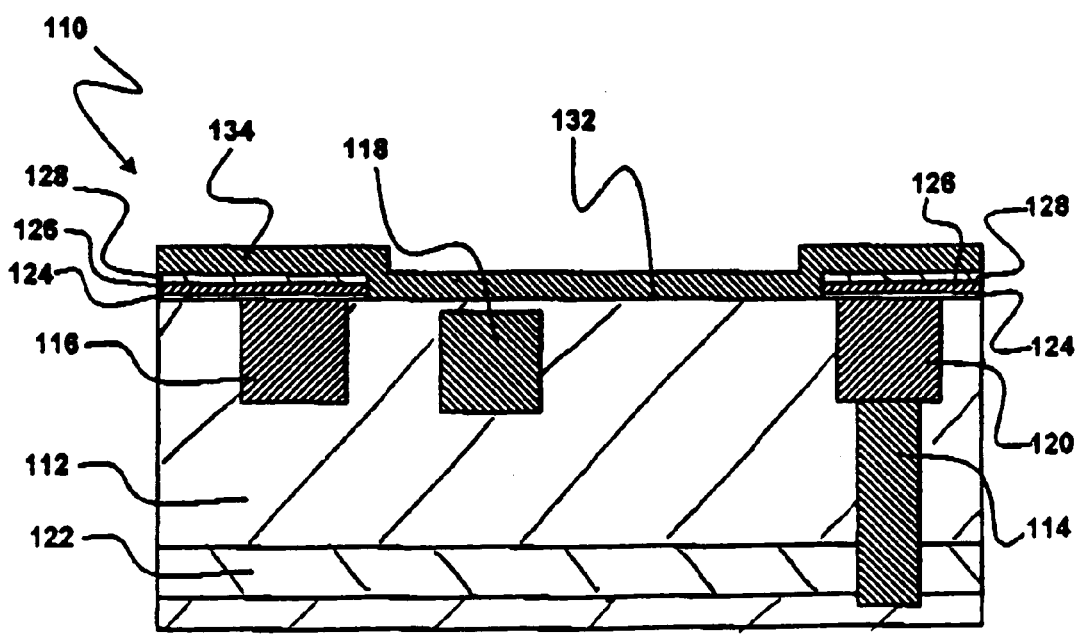
FIG. 2 is an elevational cross-section of the semiconductor structure depicted in FIG. 1 after further processing.

FIG. 2 illustrates further processing according to one embodiment. A doped layer 134 is formed over the topology. Doped layer 134 will have either p- or n-doping depending upon the bipolar configuration. In one embodiment, the doping is P++. In one embodiment, the doping is P+. In another embodiment, the doping is P. In yet another embodiment, the doping is P–. In one embodiment, doped layer 134 is a p-doped layer as set forth herein.

Figure 3:
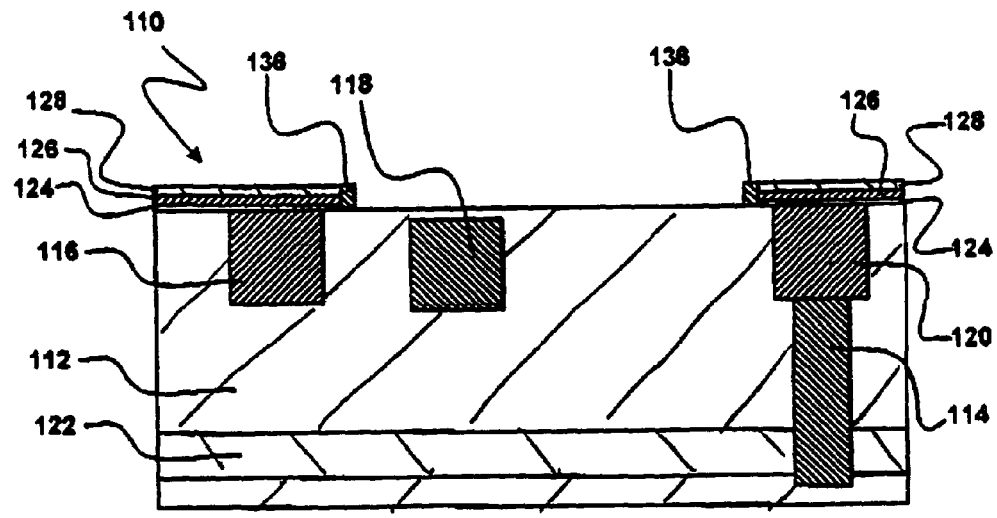
FIG. 3 is an elevational cross-section of the semiconductor structure depicted in FIG. 2 after further processing.

FIG. 3 illustrates further processing according to an embodiment of the present invention. Doped layer 134 (FIG. 2) is etched in a spacer etch in order to form a doped spacer 136 at the topology. Doped spacer 136 acts as a dopant source to accomplish an embodiment of the present invention. Alternatively, doped spacer 136 may be sufficiently undoped so as to act as a dopant getterer or dopant sink to cause a dopant gradient in substrate 112 in the vicinity of doped spacer 136 as will be set forth herein.

Figure 4:
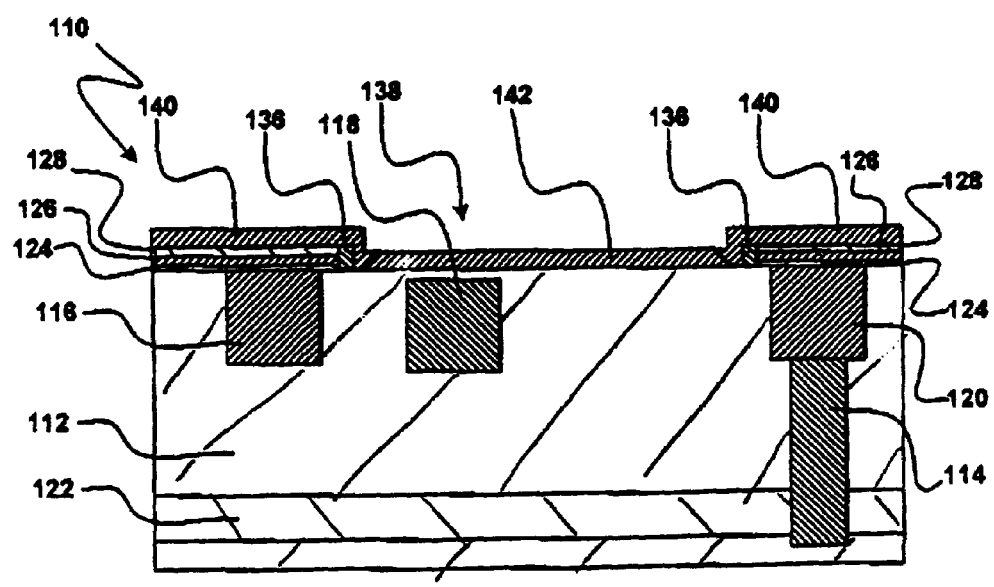
FIG. 4 is an elevational cross-section of the semiconductor structure depicted in FIG. 3 after further processing.

FIG. 4 illustrates further processing according to an embodiment of the present invention. An epitaxial base layer 138 is formed over substrate 112 that will eventually be patterned between the two occurrences of doped spacer 136 as seen in cross-section. Above and on the doped spacer 136 and second layer 128 a polycrystalline epitaxial base 140 is formed. Similarly, above and on the monocrystalline silicon of substrate 112, a monocrystalline epitaxial base 142 is formed.

Processing conditions for the formation of epitaxial base layer 138 may be carried out according to process flows that are known in the art. Epitaxial base layer 138 may be carried out by a chemical vapor deposition (CVD) process flow selected from low-pressure CVD (LPCVD), reactive-plasma CVD (RCVD), plasma-enhanced CVD (PECVD), and combinations thereof as known in the art. By way of one non-limiting example, the CVD process flow may be carried out in a pressure range from about $10^{-2}$ Torr, to about $2 \times 10^{-1}$ Torr. The CVD gas may be supplied as a silane type gas or a doped silane type gas.

Figure 5:
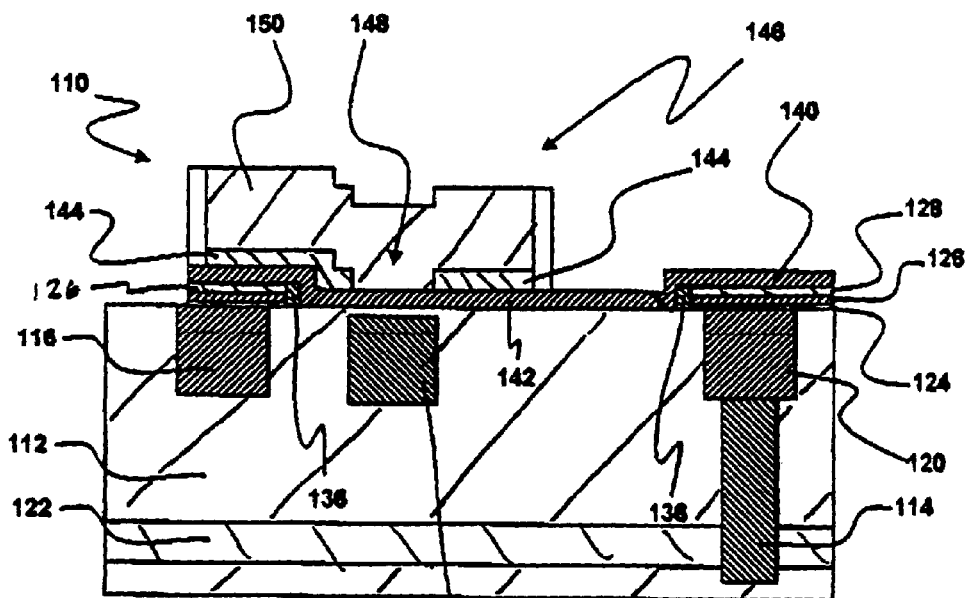
FIG. 5 is an elevational cross-section of the semiconductor structure depicted in FIG. 4 after further processing.

FIG. 5 illustrates one embodiment of the present invention in which more structures comprising a BJT 110 are formed. An emitter-base dielectric layer 144 is formed to space apart an emitter structure 146 from monocrystalline epitaxial base 142. To that purpose, an interlayer dielectric layer is blanket deposited and patterned to make an emitter opening 148, also referred to as an emitter cut, between monocrystalline epitaxial base 142 and what is to become the emitter polysilicon 150 of emitter structure 146. As a result, emitter opening 148 will facilitate formation of an intrinsic base as set forth below.

Figure 6:
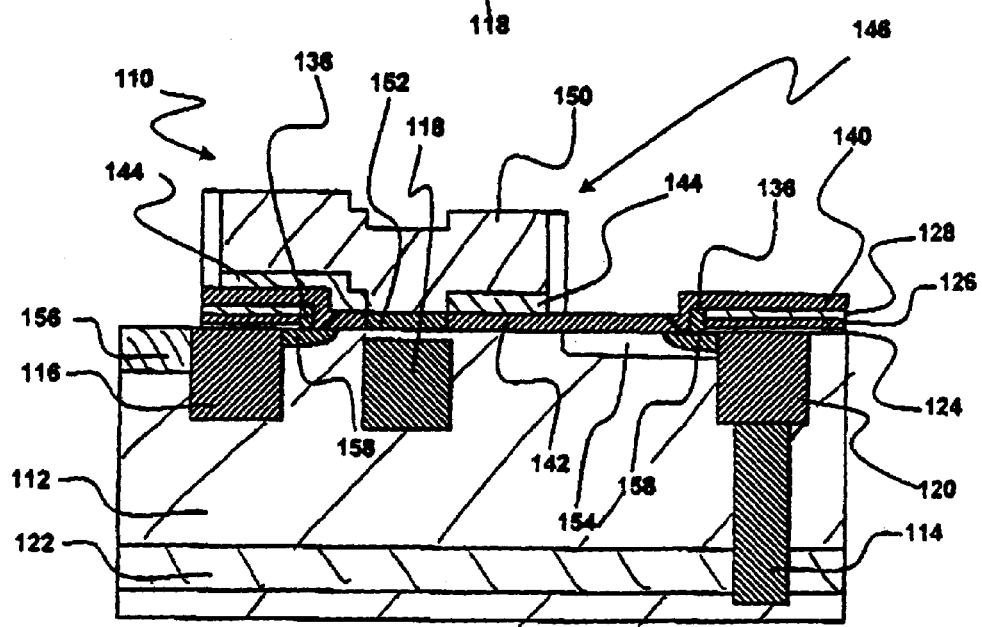
FIG. 6 is an elevational cross-section of the semiconductor structure depicted in FIG. 5 after further processing.

Leakage block structures are formed according to a diffusion process flow embodiment of the present invention. FIG. 6 illustrates further processing to that purpose. The emitter polysilicon 150 of emitter structure 146 is either doped in situ, or it is ion-implantation doped after formation thereof. Dopant is formed to achieve a given concentration according to a specific application. Between the emitter polysilicon 150 of emitter structure 146 and monocrystalline epitaxial base 142, thermal processing is used to form an emitter/base junction region 152 in monocrystalline epitaxial base 142. Diffusion of dopant element(s) from the emitter polysilicon 150 of emitter structure 146 may assist to form emitter/base junction region 152.

Further processing is carried out to form a base tap 154 and a collector tap 156 according to process flows known in the art. As such, a BJT 110 is formed according to an embodiment. Essential to BJT 110 is emitter structure 146, emitter/base junction region 152, and collector structure 118.

It is noted that dopant that is diffused out of doped spacer 136 forms a leakage block structure 158 that allows the inventive BJT 110 to have smaller dimensions than the existing BJT. Leakage block structure 158 is a region where dopant has a concentration gradient within substrate 112. In other words, substrate 112 is an integral crystalline structure wherein leakage block structure 158 is disposed, and a concentration gradient within leakage block structure 158 exists in the direction of doped spacer.

In accordance with one embodiment of the present invention, a process flow is carried out during which out-diffused dopant from doped spacer 136 forms leakage block structure 158, especially at the monocrystalline-polycrystalline interface of epitaxial base layer 138. In an embodiment where doped spacer 136 is p-doped with, by way of non-limiting example, boron, a process flow is carried out under thermal conditions in a range from about 700° C. to about 1,200° C. In another non-limiting example where doped spacer 136 is p-doped, a process flow is carried out under thermal conditions in a range from about 800° C. to about 1,100° C. In yet another non-limiting example where doped spacer 136 is p-doped, a process flow is carried out under thermal conditions in a range from about 900° C. to about 1,000° C. Processing times may vary according to a specific embodiment and process integration. Processing times will be selected based upon dopant concentration in doped spacer 136, and the amount of out-diffusion needed in order to block the monocrystalline-polysilicon interface, between polycrystalline epitaxial base 140 and monocrystalline epitaxial base 142, of epitaxial base layer 138. Accordingly, leakage block structure 158 is formed in substrate 112. The leakage block structure 158 may block either current, potential, or both.

The out-diffused dopant may be referred to as a leakage block structure 158 that represents a dopant gradient in an integral section of monocrystalline silicon; meaning the non-epitaxial portion or the monocrystalline silicon of substrate 112. As is illustrated, a BJT 110 is formed between the two doped spacers 136.

In an alternative embodiment, doped spacer 136 may be substantially undoped such that it behaves as a dopant getterer or dopant sink for dopant within substrate 112. Accordingly, leakage block structure 158 is a region of substrate 112 with depleted dopant with respect to the rest of substrate 112. In this manner, electrical activity therein is hindered after a manner that is opposite to a substantially undoped leakage block structure 158.

Several of the embodiments set forth in this disclosure may be used with a bipolar-complementary metal oxide semiconductor (BiCMOS) process flow. For example, first layer 126 and second layer 128 are utilized as protective layers over a CMOS region (not depicted) of substrate 112 during forming doped spacer 136 at the topology. Thereafter, a CMOS process flow may be carried out in which at least portions of first layer 126 and second layer 128 are opened.

Figure 7:
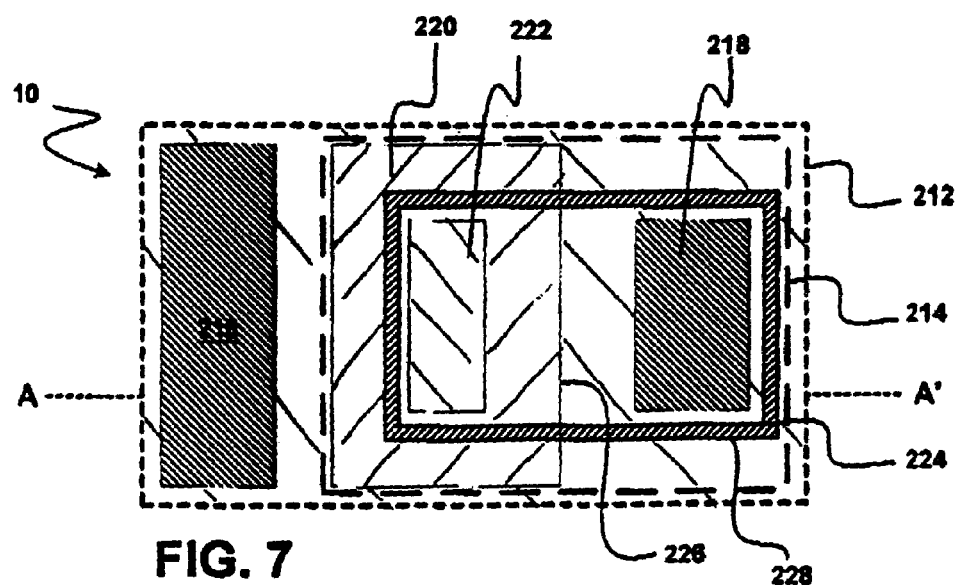
FIG. 7 is a plan view of one embodiment of a BJT layout wherein the perimeters of various structures are depicted.

FIG. 7 is an illustration of a bipolar junction transistor (BJT) layout 210 according to the present invention. BJT layout 210 may be the layout of BJT 110 as set forth herein. BJT 110 as depicted in FIG. 6 is related to BJT layout 210 layout along the section line A–A'. A collector perimeter 212 comprises the overall outline of the BJT layout 210. Within collector perimeter 212 is an epitaxial base perimeter 214, a collector tap 216, a base tap 218, a polysilicon emitter 220, and an emitter/base junction region 222 also referred to as an emitter cut. Epitaxial base perimeter 214 includes all of epitaxial base layer 138 as depicted in FIG. 4. Additionally, a leakage block structure 224 of diffused dopant is seen encircling both emitter/base junction region 222 and base tap 218. In comparison to the doping pattern of first space 32, depicted in FIG. 10, the leakage block structure 224 of diffused dopant is seen to intersect the perimeter of the polysilicon that forms polysilicon emitter 220. As such in the BJT layout 210, the emitter stack perimeter 226 and the epitaxial base layer perimeter 214 share at least one border, and parts of other borders, and the BJT layout 210 is more compact that the existing BJT layout 10 depicted in FIG. 10.

As illustrated in FIG. 7, the BJT layout 210 may have a leakage block structure perimeter 228 that is substantially symmetrical to the epitaxial base perimeter 214 and wherein the emitter stack perimeter 226 and the leakage block structure perimeter 228 intersect. By "substantially symmetrical, it is understood that where epitaxial base perimeter 214, if it is substantially rectangular, will contain a likewise rectangular leakage block structure 224, although they may not necessarily be centered with relation to each other. "Substantially symmetrical" may also be understood to be two rectangular perimeters that have parallel major-length sides and parallel minor-length sides. For example, epitaxial base perimeter 214 and leakage block perimeter 228 are substantially symmetrical because they have parallel major-length sides and parallel minor-length sides, but they are not centered with relation to each other. By contrast, epitaxial base perimeter 214 and emitter stack perimeter 226 are not substantially symmetrical because the major-length sides of one are parallel with the minor-length sides of the other.

Figure 10:
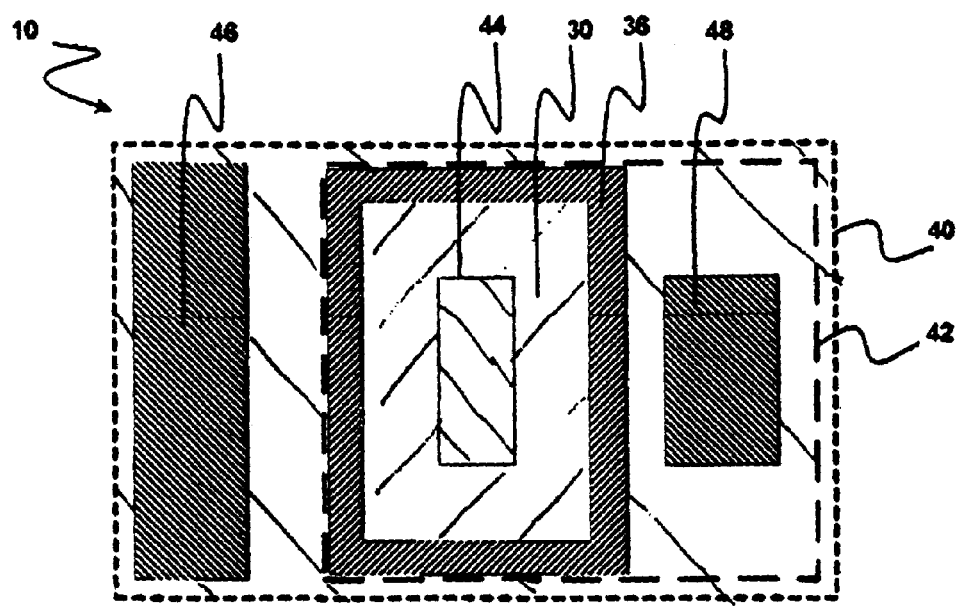
FIG. 10 is a plan view of a prior art BJT layout wherein the perimeters of various structures are depicted.
Figure 9:
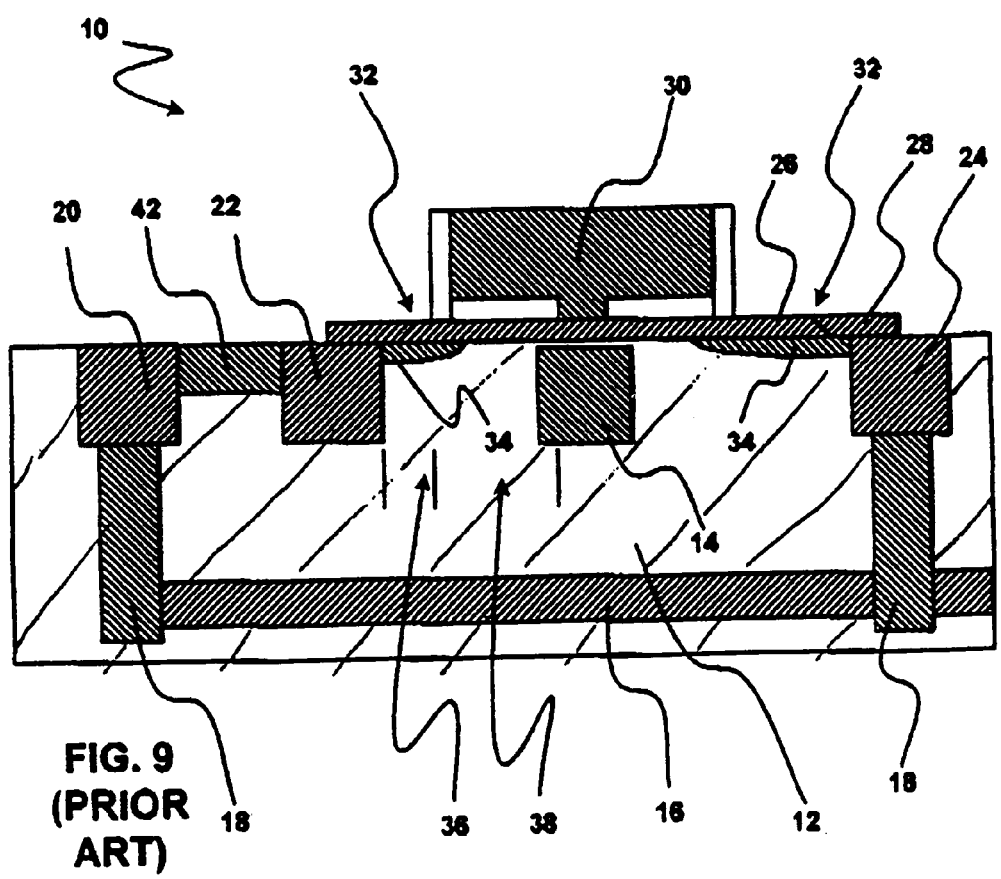
FIG. 9 is an elevational cross-section of a semiconductor structure according to present technique.

The leakage block structure perimeter 228 is substantially symmetrical to the epitaxial base perimeter 214. The emitter stack perimeter 226 and the leakage block structure perimeter 228 intersect. The leakage block structure perimeter 228 is enclosed within the epitaxial base perimeter 214. Whereas the base tap 218 is enclosed by the leakage block structure 224, it can be seen by contrast from FIG. 10 that the base tap 44 is not enclosed by the doped enclosure 34 (FIG. 9) that fills first space 36 (FIG. 10).

Figure 8:
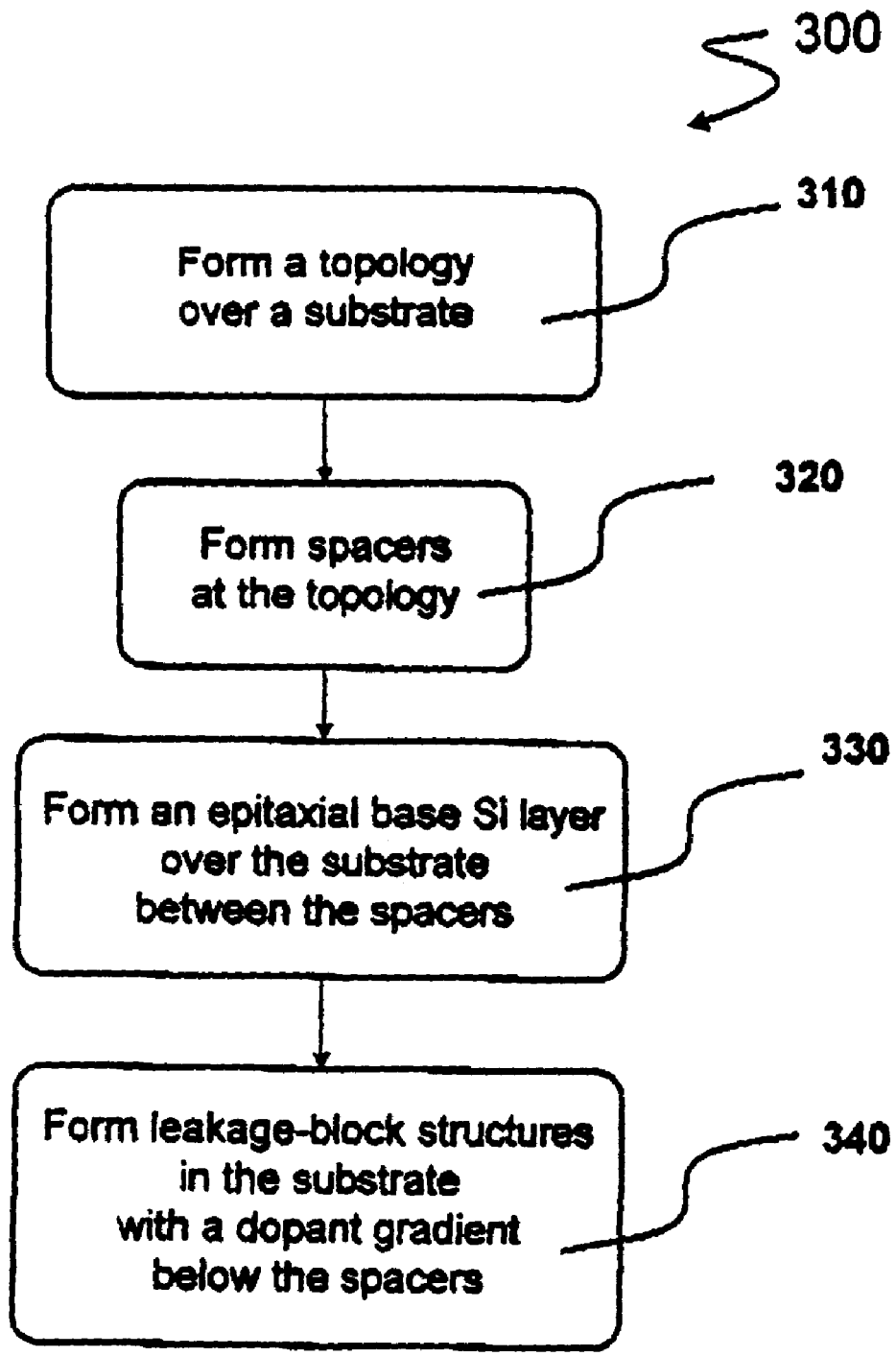
FIG. 8 is a flow chart that describes an inventive process flow according to an embodiment of the present invention.

FIG. 8 is a process flow diagram 300 that illustrates one embodiment of the present invention. The inventive process may commence with forming 310 a topology over a substrate. Thereafter, the process flow may continue by forming 320 spacers (when viewed in cross-section) at the topology, Next or subsequent thereto, the process flow contemplates forming 330 an epitaxial base layer between the two spacers. The interface of the epitaxial monocrystalline- and polycrystalline silicon is thereafter dealt with by forming 340 leakage-block structures in the substrate from the two spacers. Accordingly, the leakage-block structures are formed in the substrate with a dopant gradient below the spacers. Where the dopant gradient is higher in the spacers than in the substrate, out-diffusion may have occurred from the spacers to the substrate. Where the dopant gradient is lower in the spacers, infusion may have occurred, from the substrate to the spacers. Thereafter, the process flow proceeds by forming a BJT between the two spacers.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process for manufacturing a device on a substrate comprising:

forming in the substrate, deep and shallow trench isolations, buried layers and collector wells for the device;

forming a layer of etch resistant material over the substrate;

defining an active base region of the device by removal of the layer of etch resistant material over a portion of the surface of the substrate to expose an active base region;

forming a boron doped oxide film over the base region and the layer of etch resistant material;

anisotropically removing the boron doped oxide film from the active base region and the layer of etch resistant material leaving doped spacers of boron dope oxide film adjacent the active base region at a perimeter of the active base region;

depositing an epitaxial polycrystalline film over the layer of etch resistant material and an epitaxial crystalline film over the active base region, wherein the epitaxial polycrystalline film and the epitaxial crystalline film form a crystalline/polycrystalline boundary.

2. The process according to claim 1, further comprising:

selecting a process flow integration wherein the layer of etch resistant material includes a first layer and a second layer; followed by selecting the first layer and the second layer, wherein the first layer and the second layer are selected from a first oxide layer and a second nitride layer, a first nitride layer and a second nitride layer, a first oxide layer and a second oxide layer, a first nitride layer and a second nitride layer, a first inorganic layer and a second inorganic layer, a first organic layer and a second inorganic layer, a first organic layer and a second organic layer, and a first inorganic layer and a second inorganic layer.

3. The process according to claim 1, further including:

forming the layer of etch resistant material including forming an oxide pre-layer on the substrate; forming a first layer from an oxide; and forming a second layer from a nitride;

patterning a mask over the second layer;

anisotropic dry etching the second layer; and wet etching the first layer.

4. The process according to claim 3, wherein the anisotropic dry etching is a reactive ion etch (RIE), followed by an alternative wet clean.

5. The process according to claim 1, wherein the process is a bipolar-complementary metal oxide semiconductor (BiCMOS) process, including:

utilizing the etch resistant material as a protective layer over the CMOS region of the substrate during diffusing dopant from the doped spacers into the substrate; and conducting a CMOS process.

* * * * *